(12) United States Patent
Kim

(10) Patent No.: US 7,015,103 B2
(45) Date of Patent: Mar. 21, 2006

(54) METHOD FOR FABRICATING VERTICAL TRANSISTOR

(75) Inventor: Hag Dong Kim, Suwon (KR)

(73) Assignee: DongbuAnam Semiconductor Inc., Seoul (KR)

(*) Notice: Subject to any disclaimer, the term of this patent is extended or adjusted under 35 U.S.C. 154(b) by 0 days.

(21) Appl. No.: 11/020,095

(22) Filed: Dec. 27, 2004

(65) Prior Publication Data

US 2005/0202635 A1    Sep. 15, 2005

(30) Foreign Application Priority Data

Dec. 27, 2003    (KR) ...................... 10-2003-0098091

(51) Int. Cl.
*H01L 21/336* (2006.01)

(52) U.S. Cl. ...................... 438/268; 438/270; 438/589; 438/137

(58) Field of Classification Search ................ 438/268, 438/270, 589, 137, 138
See application file for complete search history.

(56) References Cited

U.S. PATENT DOCUMENTS 4,890,144 A * 12/1989 Teng et al. .................... 257/66

5,160,491 A * 11/1992 Mori ........................... 438/270

* cited by examiner

*Primary Examiner*—Jack Chen
(74) *Attorney, Agent, or Firm*—Oblon, Spivak, McClelland, Maier & Neustadt, P.C.

(57) ABSTRACT

A method for fabricating a vertical transistor including forming a first junction area in a semiconductor substrate, forming a polysilicon layer by using an epitaxial growth in the substrate, forming a second junction area in the polysilicon layer, and forming a plug junction area in the polysilicon layer, the plug junction area electrically connected with the first junction area. The method also includes forming a trench by selectively etching and removing the polysilicon layer to expose the first junction area, sequentially depositing a gate insulating layer and a conductive layer for a first gate electrode on the trench and the polysilicon layer, and forming the first gate electrode by selectively patterning the conductive layer. The method further includes forming an insulating interlayer on an entire surface of the substrate including the first gate electrode, forming via-holes for exposing predetermined portions of the first junction area, the first gate electrode, and the plug junction area, and forming source/drain electrodes and a second gate electrode respectively connected with the first junction area, the first gate electrode, and the plug junction area by forming a metal layer within the via-holes.

6 Claims, 6 Drawing Sheets

METHOD FOR FABRICATING VERTICAL TRANSISTOR

BACKGROUND OF THE INVENTION

1. Field of the Invention

The present invention relates to a method for fabricating a vertical transistor, and more particularly, to a method for fabricating a vertical transistor which is suitable for minimizing the size of a semiconductor device.

2. Discussion of the Related Art

With high integration of a semiconductor device, a size of the semiconductor device decreases, whereby a channel length of the semiconductor device also decreases. The decrease of the channel length in the semiconductor device may result in undesirable electric characteristics, for example, a short channel effect.

In order to overcome the short channel effect, it is necessary to realize a vertical decrease in the size of the device, such as a decrease in a thickness of a gate insulating layer and a junction depth of source/drain, as well as a horizontal decrease in the size of the device, such as a decrease in a length of a gate electrode. Also, according to the horizontal and vertical decrease, an applied voltage decreases and a doping density of a semiconductor substrate increases. Thus, there is a requirement for the effective control of a doping profile of a channel region.

However, despite the decrease in the size of the semiconductor device, the operational power needed for the electronic equipment has not decreased. For example, in case of an NMOS transistor, electrons provided from the source are excessively accelerated in state of a high potential gradient, whereby hot carriers generate. Accordingly, an LDD (Lightly Doped Drain) structure having an improved NMOS transistor has been researched and developed.

In the LDD-structure transistor, a lightly-doped n-type (n⁻) region is positioned between a channel and a highly-doped n-type (n⁺) source/drain. The lightly-doped n-type (n⁻) region buffers a high drain voltage around the drain junction. Thus, it is possible to prevent inducement of a potential gradient, thereby preventing the generation of hot carriers. Based on research for technology of high-integration semiconductor devices, various methods for fabricating a MOSFET of the LDD structure have been proposed. Among them, the method for forming the LDD structure by forming spacers at sidewalls of the gate electrode is most generally used.

However, due to high integration in semiconductor devices, it is hard to control the short channel effect with the LDD structure. Accordingly, to satisfy this request for the optimal structure of minimizing the short channel effect, a vertical transistor is proposed. A vertical transistor is suitable for realizing a minimum size for the semiconductor device by decreasing the channel length.

In the vertical transistor, the channel region is formed in the vertical direction. The channel length is determined dependent on not a width of an active region, but a thickness of the active region. As compared with a conventional horizontal transistor, the vertical transistor has the advantageous characteristics such as a decrease in the channel length without photolithography.

SUMMARY OF THE INVENTION

Accordingly, the present invention is directed to a method for fabricating a vertical transistor that substantially obviates one or more problems due to limitations and disadvantages of the related art.

The present invention advantageously provides a method for fabricating a vertical transistor which is suitable for minimizing a size of a semiconductor device.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a vertical transistor includes steps of forming a first junction area in a semiconductor substrate, forming a polysilicon layer by using an epitaxial growth in the substrate, forming a second junction area in the polysilicon layer, forming a plug junction area in the polysilicon layer, the plug junction area being electrically connected with the first junction area, forming a trench by selectively etching and removing the polysilicon layer to expose the first junction area, sequentially depositing a gate insulating layer and a conductive layer for a first gate electrode on the trench and the polysilicon layer, forming the first gate electrode by selectively patterning the conductive layer, forming an insulating interlayer on an entire surface of the substrate including the first gate electrode, forming via-holes for exposing predetermined portions of the first junction area, the first gate electrode, and the plug junction area, and forming source/drain electrodes and a second gate electrode respectively connected with the first junction area, the first gate electrode, and the plug junction area by forming a metal layer within the via-holes.

The first and second junction areas and the plug junction area may be formed by implanting ions at an energy between about 5 keV and about 50 keV and a density between about $1 \times 10^{15}$ and about $5 \times 10^{15}$ ions/cm².

The polysilicon layer may be formed with a thickness between about 0.5 µm and about 3 µm.

In the method of fabricating the vertical transistor according to the present invention, it is possible to minimize the channel length, thereby preventing the short channel effect. As a result, it is possible to obtain a high driving current of the transistor.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to exemplary embodiments of the present invention which are illustrated in the accompanying drawings. Wherever possible, the same reference numbers will be used throughout the drawings to refer to the same or like parts.

Hereinafter, a method for fabricating a vertical transistor according to the present invention will be described with reference to the accompanying drawings. FIG. 1A to FIG. 1F show cross sectional views of the fabrication process for a vertical transistor according to the present invention.

Figure 1A:
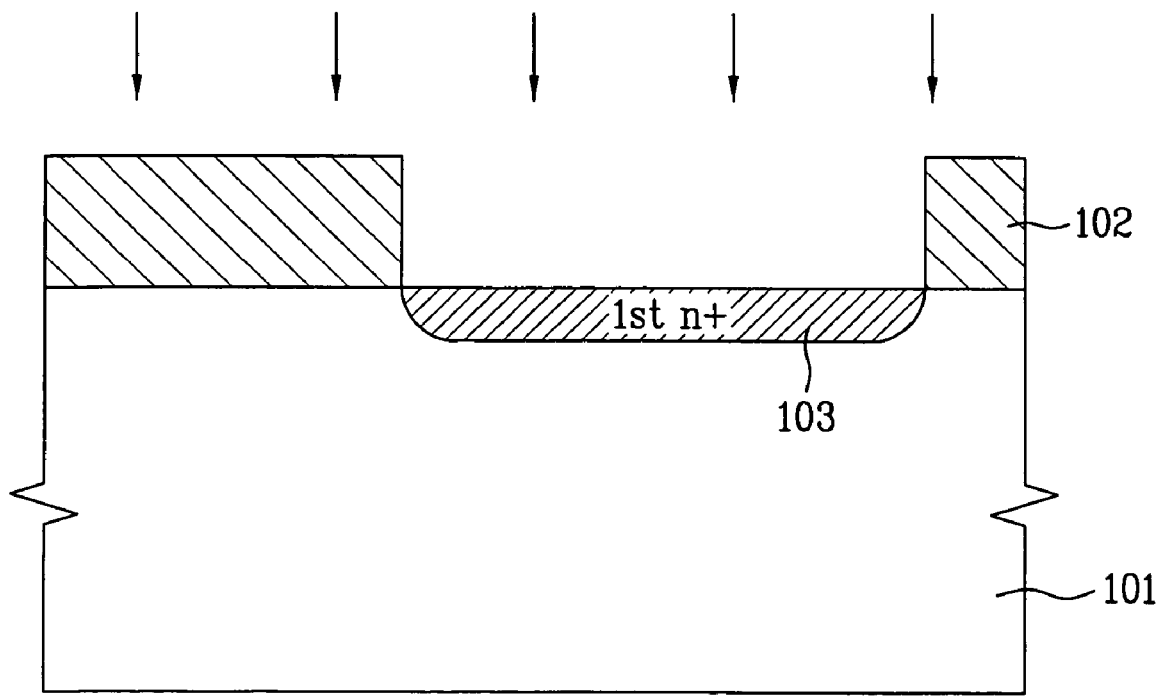
FIG. 1A to FIG. 1F show cross sectional views of the fabrication process for a vertical transistor according to the present invention.

First, as shown in FIG. 1A, a semiconductor substrate 101 of mono-crystal silicon is prepared. The semiconductor substrate 101 may be formed of a first conductive type mono-crystal silicon, wherein the first conductive type may be n-type or p-type. For convenience of explanation, herein, the first conductive type will be referred to as the p-type.

In this state, a photoresist layer is coated on an entire surface of the semiconductor substrate 101. The photoresist layer is selectively patterned to expose a portion of the semiconductor substrate 101 corresponding to a first junction area 103, thereby forming a first photoresist pattern 102. Second conductive type impurity ions, for example, n-type arsenic (As) ions, are implanted into the entire surface of the semiconductor substrate 101. The second conductive type impurity ions may have an energy of about 5 keV to about 50 keV and a density of about $1 \times 10^{15}$ and about $5 \times 10^{15}$ ions/cm$^2$. Accordingly, the first junction area 103 is formed in a predetermined portion of the semiconductor substrate 101.

Figure 1B:
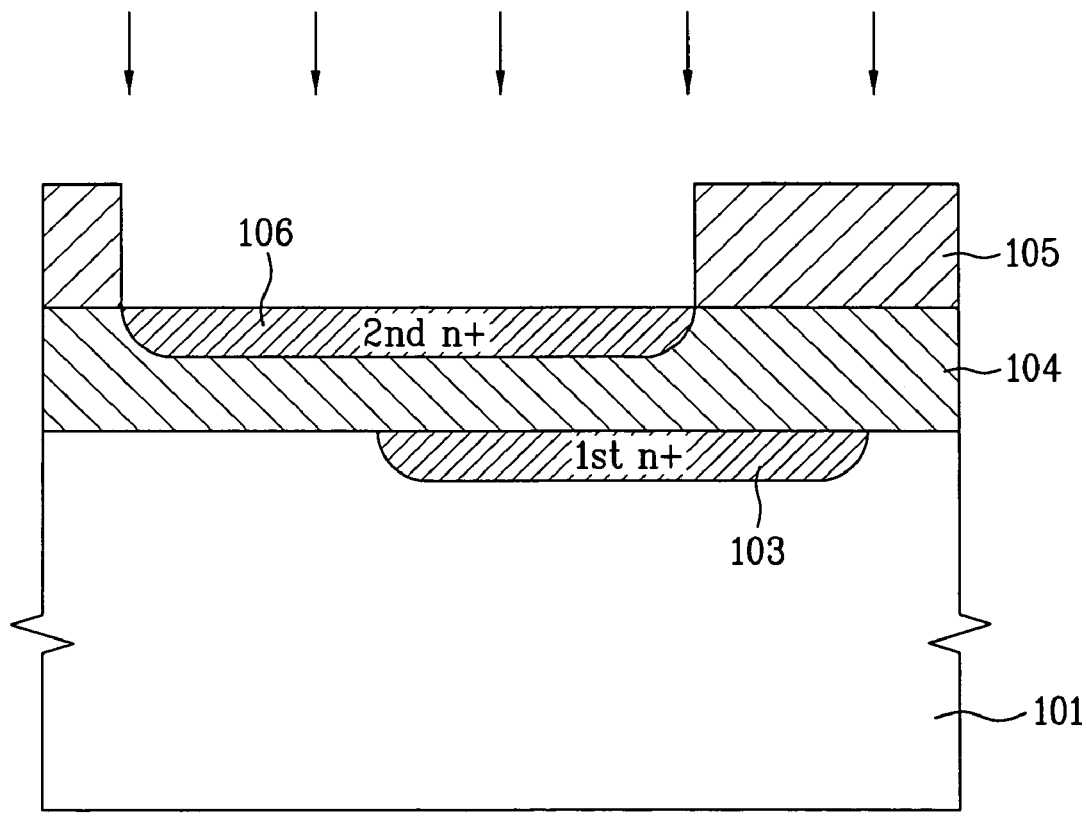

As shown in FIG. 1B, after removing the first photoresist pattern 102, a thermal process is performed on the semiconductor substrate 101, thereby progressing an epitaxial growth to a predetermined thickness. As a result, a polysilicon layer 104 is formed by the epitaxial growth. In one exemplary embodiment, the polysilicon layer 104 is formed with a thickness between about 0.5 μm and about 3 μm in due consideration of a channel length of the transistor.

In this state, a photoresist layer is coated on the entire surface of the substrate 101. The photoresist layer is selectively patterned to expose a portion of the polysilicon layer 104 corresponding to a second junction area 106, thereby forming a second photoresist pattern 105. Second conductive type impurity ions, for example, n-type arsenic (As) ions, are implanted into the entire surface of the substrate 101. The second conductive type impurity ions may be implanted with an energy between about 5 keV and about 50 keV and a density between about $1 \times 10^{15}$ and about $5 \times 10^{15}$ ions/cm$^2$. Thus, the second junction area 106 is formed in a predetermined portion of the polysilicon layer 104. Meanwhile, although not shown, before forming the second junction area 106, a channel ion area of the vertical transistor may be preformed by implanting channel ions into the polysilicon layer 104.

Figure 1C:
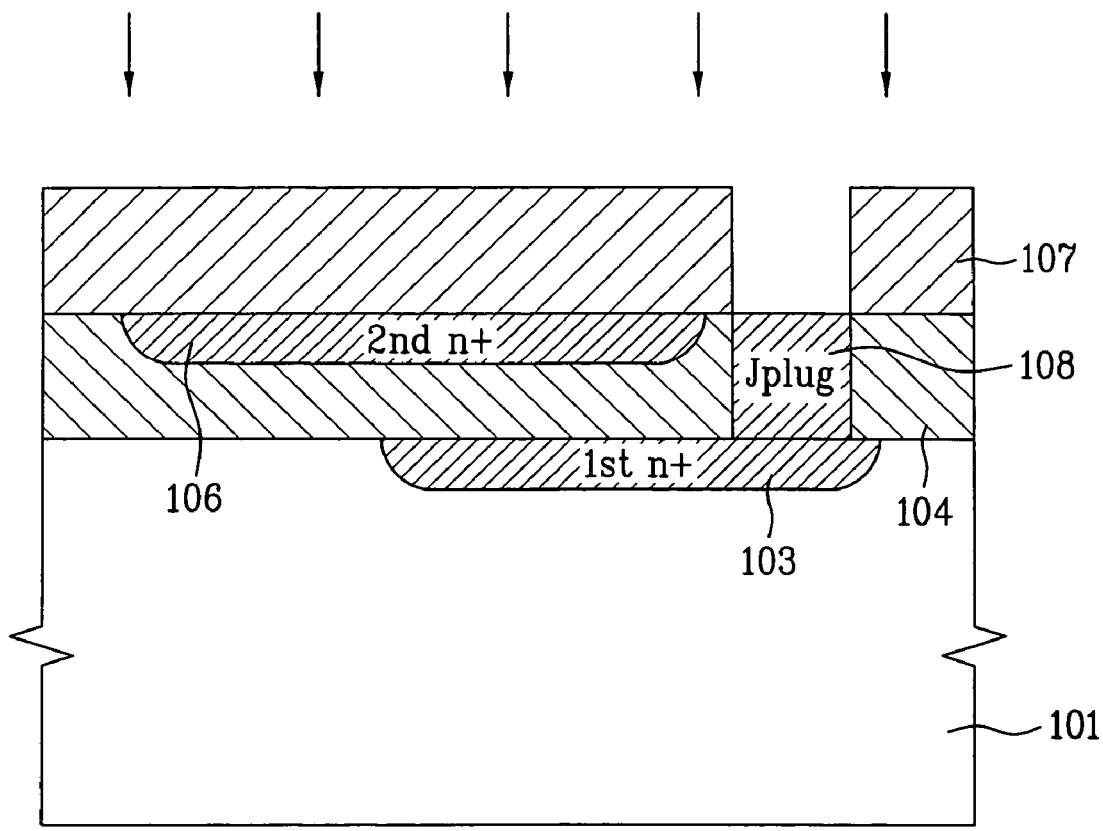

As shown in FIG. 1C, after removing the second photoresist pattern 105, a photoresist is coated on the entire surface of the substrate 101. The photoresist is selectively patterned, thereby forming a third photoresist pattern 107 to expose a portion of the polysilicon layer 104 corresponding to a plug junction area 108. Second conductive type impurity ions, for example arsenic (As) ions, are implanted into the entire surface of the substrate 101. The second conductive type impurity ions may be implanted with an energy between about 5 keV and about 50 keV and a density between about $1 \times 10^{15}$ and about $5 \times 10^{15}$ ions/cm$^2$. The third photoresist pattern 107 is used as an ion implantation mask, thereby forming the plug junction area 108 in the exposed portion of polysilicon layer 104. The plug junction area 108 is connected with the first junction area 103. Also, the plug junction area 108 electrically connects a metal line with the first junction area 103.

When forming the first and second junction areas 106 and the plug junction area 108, a thermal process is performed on the substrate 101. This activates the ions implanted into the first and second junction areas 106 and the plug junction area 108. The thermal process is performed by rapid treatment in an inert gas atmosphere of nitrogen N at a temperature between about 800° C. and about 1050° C., for about 5 to about 30 seconds.

Figure 1D:
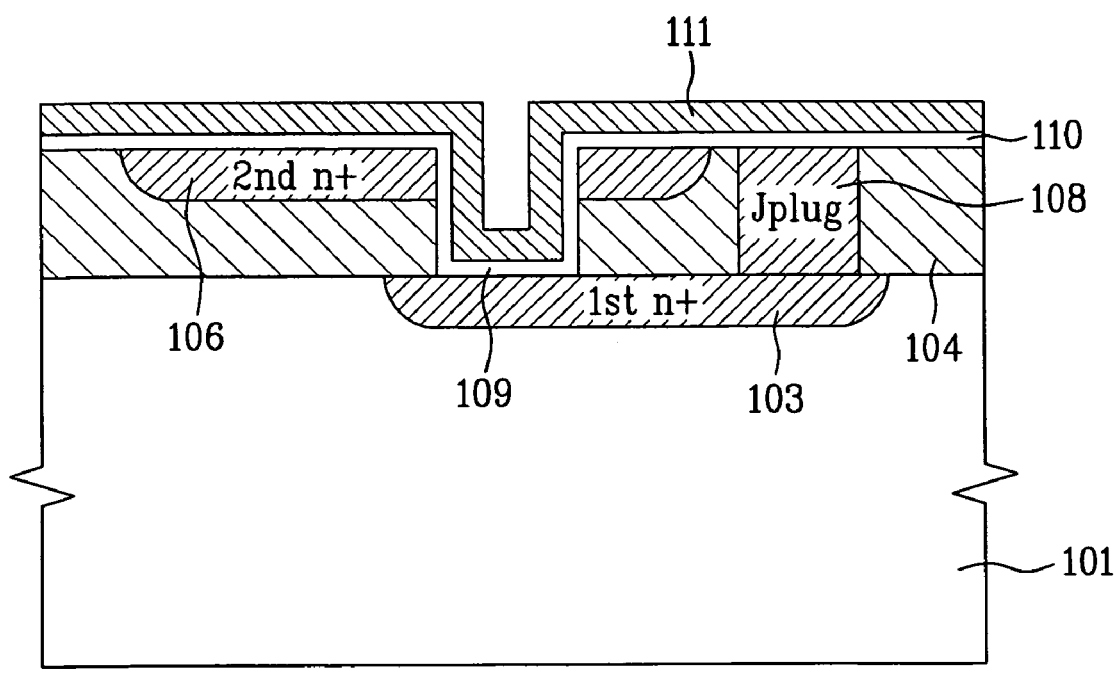

As shown in FIG. 1D, a predetermined portion of the polysilicon layer 104 of the epitaxial growth layer is etched a depth of at about 0.3 μm to about 2 μm, thereby forming a trench 109. By forming the trench 109, it is possible to expose a predetermined portion of the first junction area 103. A gate insulating layer 110 and a conductive layer 111 for a first gate electrode 111a are sequentially deposited on the polysilicon layer 104 including the trench 109. The gate insulating layer 110 is formed at a thickness between about 20 Å and about 50 Å. The conductive layer 111 for the first gate electrode 111a is formed at a thickness between about 2000 Å and about 3000 Å.

Figure 1E:
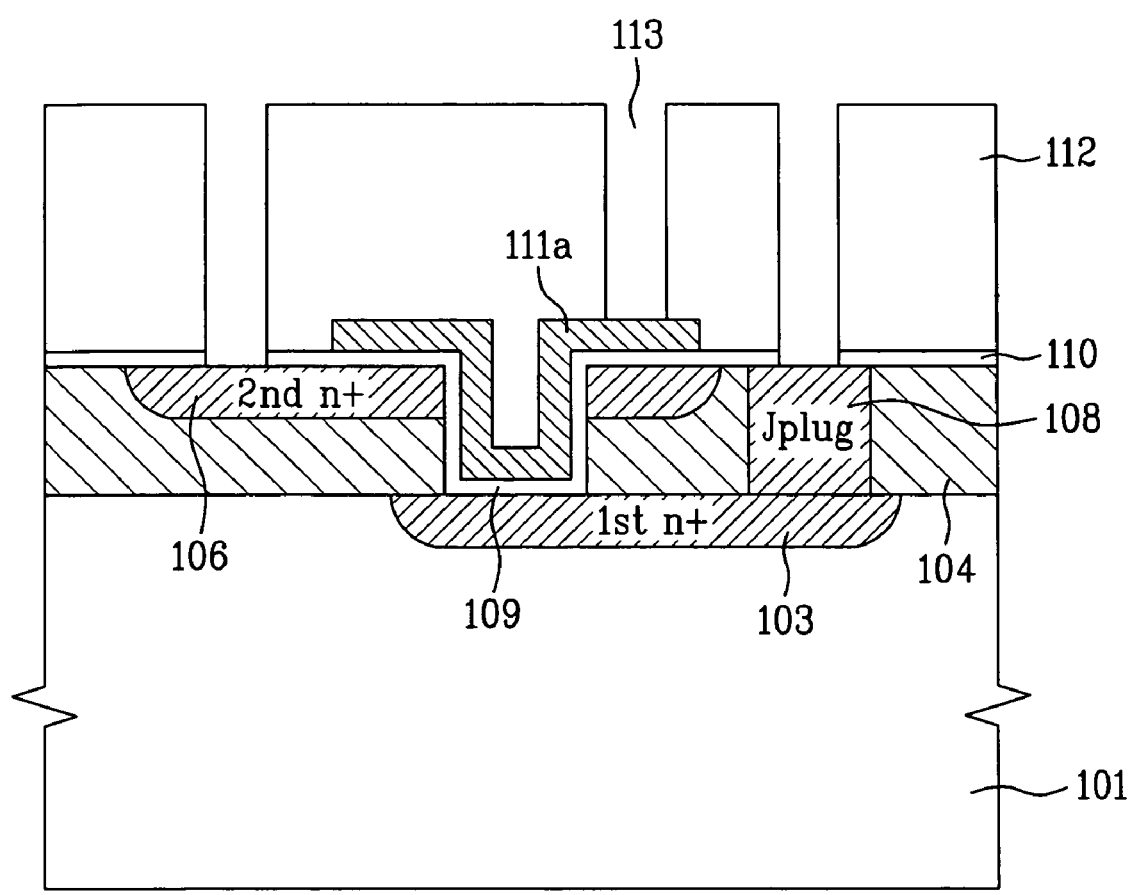

As shown in FIG. 1E, the conductive layer 111 for the first gate electrode 111a is selectively patterned to form the first gate electrode 111a. An insulating interlayer 112 is formed on the entire surface of the substrate 101, including the first gate electrode 111a. The insulating interlayer 112 and the gate insulating layer 110 are selectively etched by photolithography and etching. This forms a plurality of via-holes 113 for exposing predetermined portions of the second junction area 106, the first gate electrode 111a, and the plug junction area 108.

Figure 1F:
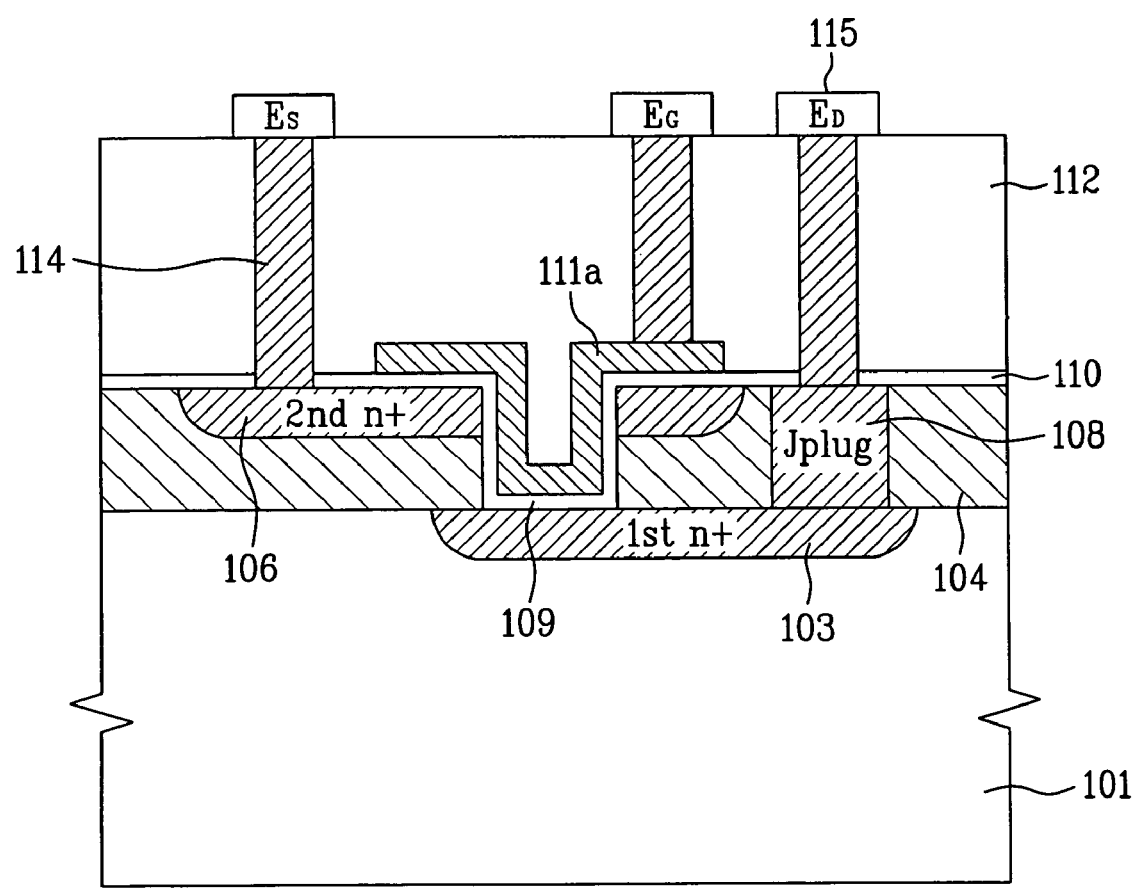

As shown in FIG. 1F, after depositing a metal layer on the insulating interlayer 112 to fill the via-holes 113, the metal layer is smoothed by CMP until the surface of the metal layer is in the same plane as the surface of the insulating layer 112, thereby forming contact plugs 114 within the via-holes 113. A second metal layer is deposited on the entire surface of the substrate 101, including the contact plugs 114. This second metal layer is selectively patterned to electrically connect with the contact plugs 114, thereby forming source/drain electrodes Es/Ed 115 and a second gate electrode Eg 115, as shown in FIG. 1F.

Accordingly, the method for fabricating the vertical transistor according to the present invention has the following advantages.

In the method of fabricating the vertical transistor according to the present invention, it is possible to minimize the channel length, thereby preventing the short channel effect. As a result, it is possible to obtain a high driving current of the transistor.

Korean Patent Application No. P2003-98091, filed on Dec. 27, 2003, is hereby incorporated by reference in its entirety.

It will be apparent to those skilled in the art that various modifications and variations can be made in the present invention without departing from the spirit or scope of the inventions. Thus, it is intended that the present invention covers the modifications and variations of this invention within the scope of the appended claims and their equivalents.

What is claimed is:

1. A method for fabricating a vertical transistor comprising:
    forming a first junction area in a semiconductor substrate;
    forming a polysilicon layer on an epitaxial layer in the substrate;
    forming a second junction area in the polysilicon layer;
    forming a plug junction area in the polysilicon layer, the plug junction area electrically connected with the first junction area;
    forming a trench by selectively etching and removing the polysilicon layer to expose the first junction area;

sequentially depositing a gate insulating layer and a conductive layer for a first gate electrode on the trench and the polysilicon layer;

forming the first gate electrode by selectively patterning the conductive layer;

forming an insulating interlayer on an entire surface of the substrate including the first gate electrode;

forming via-holes for exposing predetermined portions of the first junction area, the first gate electrode, and the plug junction area; and forming source/drain electrodes and a second gate electrode respectively connected with the first junction area, the first gate electrode, and the plug junction area by forming a metal layer within the via-holes.

2. The method of claim 1, wherein the steps of forming the first and second junction areas and the plug junction area include implanting ions at an energy between about 5 keV and about 50 keV and a density between about $1\times10^{15}$ and about $5\times10^{15}$ ions/cm$^2$.

3. The method of claim 1, wherein the step of forming the polysilicon layer includes forming the polysilicon layer with a thickness between about 0.5 $\mu$m and about 3 $\mu$m.

4. A method for fabricating a vertical transistor comprising:

a step for forming a first junction area in a semiconductor substrate;

a step for forming a polysilicon layer on an epitaxial layer in the substrate;

a step for forming a second junction area in the polysilicon layer;

a step for forming a plug junction area in the polysilicon layer, the plug junction area electrically connected with the first junction area;

a step for forming a trench by selectively etching and removing the polysilicon layer to expose the first junction area;

a step for sequentially depositing a gate insulating layer and a conductive layer for a first gate electrode on the trench and the polysilicon layer;

a step for forming the first gate electrode by selectively patterning the conductive layer;

a step for forming an insulating interlayer on an entire surface of the substrate including the first gate electrode;

a step for forming via-holes for exposing predetermined portions of the first junction area, the first gate electrode, and the plug junction area; and a step for forming source/drain electrodes and a second gate electrode respectively connected with the first junction area, the first gate electrode, and the plug junction area by forming a metal layer within the via-holes.

5. The method of claim 4, wherein the steps for forming the first and second junction areas and the plug junction area include steps for implanting ions at an energy between about 5 keV and about 50 keV and a density between about $1\times10^{15}$ and about $5\times10^{15}$ ions/cm$^2$.

6. The method of claim 4, wherein the step for forming the polysilicon layer includes a step for forming the polysilicon layer with a thickness between about 0.5 $\mu$m and about 3 $\mu$m.

* * * * *